US 011874714B2

(12) United States Patent
Lee et al.

(10) Patent No.: US 11,874,714 B2
(45) Date of Patent: Jan. 16, 2024

(54) THERMAL CONTROL AND THROTTLING FOR ELECTRONIC DEVICES INCLUDING CONTROLLERS

(71) Applicant: Samsung Electronics Co., Ltd., Suwon-si (KR)

(72) Inventors: Pyeongwoo Lee, Sunnyvale, CA (US); Young Deok Kim, San Jose, CA (US); Sumanth Jannyavula Venkata, Fremont, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 18/093,674

(22) Filed: Jan. 5, 2023

(65) Prior Publication Data

US 2023/0141036 A1  May 11, 2023

Related U.S. Application Data

(63) Continuation of application No. 16/854,801, filed on Apr. 21, 2020, now abandoned.

(60) Provisional application No. 62/985,837, filed on Mar. 5, 2020.

(51) Int. Cl.
*G06F 1/20* (2006.01)
*G06F 1/28* (2006.01)
*H05K 7/20* (2006.01)

(52) U.S. Cl.
CPC ............ *G06F 1/206* (2013.01); *G06F 1/28* (2013.01); *H05K 7/20163* (2013.01); *H05K 7/20209* (2013.01)

(58) Field of Classification Search
CPC ....... G06F 1/206; G06F 1/28; H05K 7/20163; H05K 7/20209; F25B 21/02; Y02D 10/00
USPC ........................................................ 700/299
See application file for complete search history.

(56) References Cited

U.S. PATENT DOCUMENTS

| 6,701,272 | B2 | 3/2004 | Cooper et al. |
| 7,082,772 | B2 | 8/2006 | Welch |
| 7,405,013 | B2 | 7/2008 | Yang et al. |
| 7,940,529 | B2 | 5/2011 | Merrow et al. |
| 8,665,592 | B2 | 3/2014 | Mowry et al. |
| 9,267,723 | B2 | 2/2016 | Alfille |
| 9,377,216 | B2 | 6/2016 | Klier |
| 10,458,683 | B2 * | 10/2019 | Edwards ............... H10N 10/80 |
| 2005/0174737 | A1 | 8/2005 | Meir |
| 2010/0112419 | A1 | 5/2010 | Jang et al. |
| 2012/0205526 | A1 | 8/2012 | Iwanaga |
| 2012/0279233 | A1 | 11/2012 | Chainer et al. |
| 2015/0082811 | A1 | 3/2015 | Rangarajan et al. |

(Continued)

OTHER PUBLICATIONS

Website: "Thermoelectric cooling", Wikipedia, https://en.wikipedia.org/wiki/Thermoelectric_cooling, printed Apr. 16, 2020, 9 pages.

*Primary Examiner* — Chun Cao
(74) *Attorney, Agent, or Firm* — Lewis Roca Rothgerber Christie LLP (57) ABSTRACT

A method for temperature control. In some embodiments, the method includes sensing a first temperature of an electronic device, determining that the first temperature exceeds a first threshold, and increasing a power supplied to a thermoelectric cooler thermally connected to the electronic device. The increasing of the power may include increasing the power in response to determining that the first temperature exceeds the first threshold.

19 Claims, 6 Drawing Sheets

(56) References Cited

U.S. PATENT DOCUMENTS

| | | |
|---|---|---|
| 2016/0062421 A1 | 3/2016 | Sugawara et al. |
| 2017/0023281 A1 | 1/2017 | Fromm et al. |
| 2017/0038805 A1 | 2/2017 | Chun |
| 2017/0284708 A1 | 10/2017 | Wang et al. |
| 2019/0024953 A1 | 1/2019 | Thao et al. |
| 2019/0122704 A1 | 4/2019 | Huang |
| 2019/0275864 A1 | 9/2019 | Hsieh |
| 2020/0050246 A1 | 2/2020 | Karalnik et al. |
| 2020/0089292 A1* | 3/2020 | North .................. G06F 1/206 |
| 2021/0026425 A1* | 1/2021 | Spica .................. G06F 1/185 |

* cited by examiner

THERMAL CONTROL AND THROTTLING FOR ELECTRONIC DEVICES INCLUDING CONTROLLERS

CROSS-REFERENCE TO RELATED APPLICATION(S)

This application is a continuation of U.S. patent application Ser. No. 16/854,801, filed Apr. 1, 2020, which claims priority to and the benefit of U.S. Provisional Application No. 62/985,837, filed Mar. 5, 2020, entitled "THERMAL CONTROL DEVICE MANAGEMENT FOR STORAGE DEVICE", the entire content of each of which is incorporated herein by reference.

FIELD

One or more aspects of embodiments according to the present disclosure relate to electronic devices, and more particularly to a system and method for thermal control of electronic devices.

BACKGROUND

Electronic devices that dissipate heat may be cooled, in operation, to avoid exceeding a maximum-rated operating temperature, and to avoid damage or unreliable operation that may result from operation at a high temperature. Some cooling method may use air flow to cool electronic devices and may need significant volume for ducts or passages carrying cooling air, and for heat exchangers such as finned surfaces, for transferring heat to the cooling air.

Thus, there is a need for an improved system and method for cooling.

SUMMARY

In some embodiments, a cooling system uses a thermoelectric cooler to extract heat from an electronic device at a greater rate than unassisted conduction of heat would produce. The thermoelectric cooler may conduct the heat to a heat sink (e.g., a finned heat sink cooled by cooling air), which may operate at a higher temperature (because of the heat-pumping operation of the thermoelectric cooler) than the maximum operating temperature of the electronic device. As a result, the temperature change of the cooling air may be greater than it would be absent the thermoelectric cooler, and the cooling air may carry away more heat per unit volume of cooling air, than it would absent the thermoelectric cooler. This may make it possible to achieve adequate cooling with a smaller heat sink, and with smaller cooling air passages, than would be possible absent the thermoelectric cooler.

A control system may monitor the temperature at one or more points in the system and adjust the power supplied to the thermoelectric cooler accordingly (e.g., increasing the power at relatively high system temperatures, and decreasing the power at relatively low system temperatures). The control system may also monitor the ambient humidity and avoid increasing the power supplied to the thermoelectric cooler (instead throttling the activity rate of the electronic device) when the temperature at any point in the system approaches the dew point.

According to an embodiment of the present disclosure, there is provided a method for temperature control, the method including: sensing a first temperature of an electronic device; determining that the first temperature exceeds a first threshold; and increasing a power supplied to a thermoelectric cooler thermally connected to the electronic device, wherein the increasing of the power includes increasing the power in response to determining that the first temperature exceeds the first threshold.

In some embodiments: the power supplied to the thermoelectric cooler is an average power supplied to the thermoelectric cooler; and the increasing of the power includes modifying a duty cycle of a pulse-width-modulated drive current applied to the thermoelectric cooler.

In some embodiments, the method further includes sensing a second temperature of the electronic device.

In some embodiments, the method further includes: determining that the second temperature is equal to or less than the first threshold; determining that the second temperature is within a tolerance temperature range; and decreasing the power supplied to the thermoelectric cooler.

In some embodiments, the method further includes: determining that the second temperature is equal to or less than the first threshold; determining that the second temperature is outside a tolerance temperature range; and decreasing the power supplied to the thermoelectric cooler to a power level at most approximately equal to a first power level.

In some embodiments, the method further includes sensing a third temperature of the electronic device.

In some embodiments, the method further includes: determining that the third temperature is within the tolerance temperature range; and sensing a fourth temperature of the electronic device.

In some embodiments, the method further includes, determining that the second temperature exceeds the first threshold; determining that: the power supplied to the thermoelectric cooler is at a drive limit, or a third temperature is less than a second threshold; and limiting an activity rate of the electronic device, wherein the second threshold is based on a first humidity.

In some embodiments, the method further includes: sensing the first humidity; and determining a dew point based on the first humidity, wherein the second threshold is based on the dew point.

In some embodiments, the third temperature is the second temperature.

In some embodiments, the method further includes sensing the third temperature, wherein: the sensing of the second temperature includes sensing the second temperature with a first temperature sensor; and the sensing of the third temperature includes sensing the third temperature with a second temperature sensor different from the first temperature sensor.

In some embodiments, the electronic device is a central processing unit.

In some embodiments, the sensing of the first temperature of the electronic device includes sensing a temperature of a controller of a solid state drive.

In some embodiments, the sensing of the first temperature of the electronic device includes sensing a temperature of a memory component of a solid state drive.

According to an embodiment of the present disclosure, there is provided a system, including: a processing circuit; a memory; and a first thermoelectric cooler, the memory storing instructions that, when executed by the processing circuit, cause the processing circuit to: cause a temperature sensor to sense a first temperature of a first solid state drive; determine that the first temperature exceeds a first threshold; and cause a first drive circuit to increase a power supplied to the first thermoelectric cooler, the first thermoelectric cooler being thermally connected to the first solid state drive.

In some embodiments, the system includes a first rack including: the first solid state drive; and a second solid state drive, different from the first solid state drive, wherein the instructions further cause the processing circuit to cause a second drive circuit to increase a power supplied to a second thermoelectric cooler thermally connected to the second solid state drive.

In some embodiments, the system further includes a second rack including: a third solid state drive, wherein the instructions further cause the processing circuit to cause a third drive circuit to maintain a power supplied to a third thermoelectric cooler thermally connected to the third solid state drive.

In some embodiments, the instructions further cause the processing circuit to cause the temperature sensor to sense a second temperature of the first solid state drive.

In some embodiments, the instructions further cause the processing circuit to: determine that the second temperature is equal to or less than the first threshold; determine that the second temperature is within a tolerance temperature range; and cause the first drive circuit to decrease the power supplied to the first thermoelectric cooler.

According to an embodiment of the present disclosure, there is provided a system, including: means for processing; a memory; and a first thermoelectric cooler, the memory storing instructions that, when executed by the means for processing, cause the means for processing to: sense a first temperature of a first solid state drive; determine that the first temperature exceeds a first threshold; and increase a power supplied to the first thermoelectric cooler, the first thermoelectric cooler being thermally connected to the first solid state drive.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a system and method for thermal control for electronic devices provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In some embodiments, a cooling system uses a thermoelectric cooler to extract heat from an electronic device at a greater rate than unassisted conduction of heat would produce. The thermoelectric cooler may conduct the heat to a heat sink (e.g., a finned heat sink cooled by cooling air), which may operate at a higher temperature (because of the heat-pumping operation of the thermoelectric cooler) than the maximum operating temperature of the electronic device. This may make it possible to achieve adequate cooling with a smaller heat sink, and with smaller cooling air passages, than would be possible absent the thermoelectric cooler.

A control system may monitor the temperature at one or more points in the system and adjust the power supplied to the thermoelectric cooler accordingly (e.g., increasing the power at relatively high system temperatures, and decreasing the power at relatively low system temperatures). The control system may also monitor the ambient humidity and avoid increasing the power supplied to the thermoelectric cooler (instead throttling the activity rate of the electronic device) when the temperature at any point in the system approaches the dew point. For example, if the measured temperature exceeds a first threshold, the control system may (i) if the temperature everywhere in the system is well above the dew point, and if the driver for driving the thermoelectric cooler has sufficient reserve drive capacity, increase the power supplied to the thermoelectric cooler, or (ii) if the temperature is too close to the dew point, or the driver for driving the thermoelectric cooler lacks sufficient reserve drive capacity, throttle the electronic device to reduce the rate at which it generates heat.

Some embodiments have various advantageous characteristics, including improved processing power or storage capacity within a fixed volume, improved heat dissipation, improved network efficiency, and energy reduction.

Figure 1A:
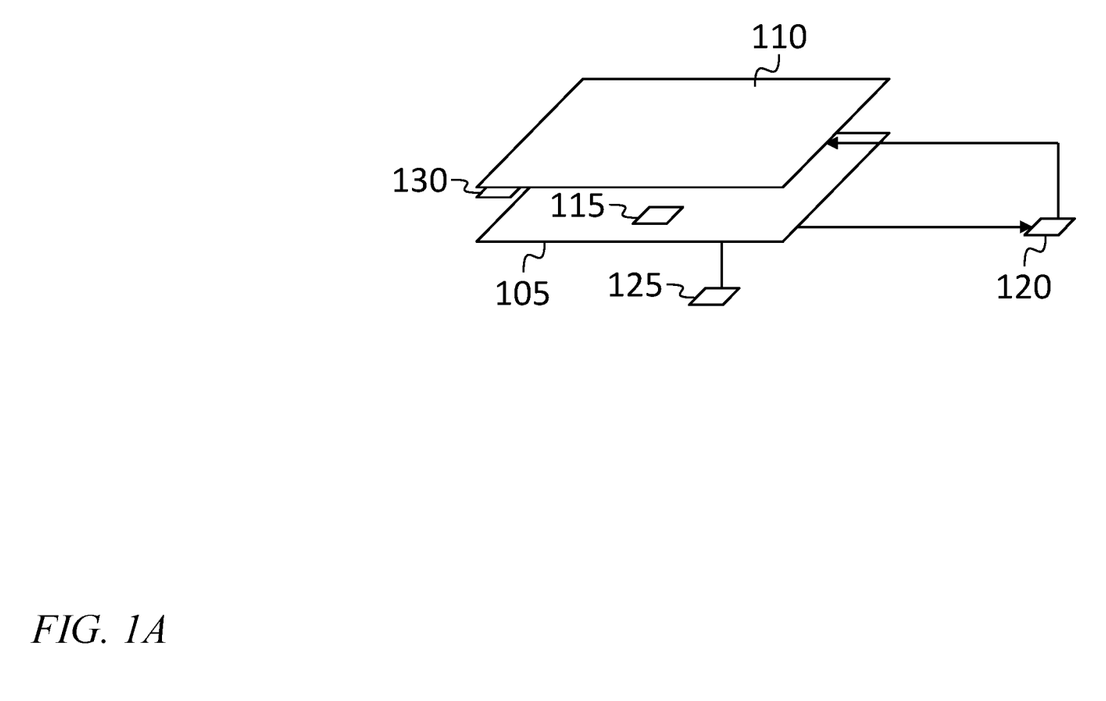
FIG. 1A is a schematic perspective drawing of an electronic device and a thermoelectric cooler, according to an embodiment of the present disclosure.

Referring to FIG. 1A, in some embodiments, an electronic device 105 may be thermally connected to a thermoelectric cooler 110. As used herein, two elements being "thermally connected" means that heat may readily flow from one to the other (e.g., as a result of the two elements being in contact, or secured together at mating surfaces, e.g., with a layer of thermal interface material between them to compensate for any imperfect flatness of the mating surfaces). The thermoelectric cooler can be implemented in a device that utilizes Peltier effect, for example. In this case, the device brings heat from one side to the other side when DC electric current flows through it. This operation can be used in some embodiments to pump heat out of the electronic device 105. The temperature of the electronic device 105 may be sensed with a first temperature sensor 115, and a suitable control signal may be calculated from the sensed temperature, by a processing circuit (discussed in further detail below) connected to the first temperature sensor 115 and configured to read the first temperature sensor 115 (e.g., through an analog to digital converter). In some embodiments, the first temperature sensor 115 is "on chip", i.e., on the same chip as the processing circuit. For simplicity, only two temperature sensors are shown in FIG. 1A. In some embodiments, there may be many more temperature sensors distributed in any type of configuration (and the temperature sensors may be grouped into first and second groups, etc.). Similarly, there may be many more humidity sensors than the one shown, distributed in any type of configuration (and the humidity sensors may be grouped into first and second groups, etc.).

The control signal may be fed to a thermoelectric cooler drive circuit 120; the thermoelectric cooler drive circuit 120 may then apply a drive current (e.g., a drive current proportional to the control signal) to the thermoelectric cooler 110. The processing circuit may be, or may be part of, the electronic device 105, as shown in FIG. 1A. As mentioned below, the processing circuit may include, but not be limited to, an FPGA, an ASIC, a dedicated processor, or the like. The processing circuit may further be connected to a water vapor pressure sensor, which may also be referred to as a humidity sensor 125 herein. The humidity sensor 125 may be used to calculate the dew point, and the processing circuit may, in generating the control signal, ensure that further cooling is not performed when any sensed temperature in the system approaches (e.g., is within a margin (which may be referred to as the "dew point margin") of, e.g., within 3 degrees Celsius of) the dew point. The system may include a second temperature sensor 130, which may be at a point in the system (e.g., directly on the cold side of the thermoelectric cooler 110) which in operation is likely to be the coldest point in the system, and which, in operation, may be at a lower temperature than the first temperature sensor 115.

Figure 1B:
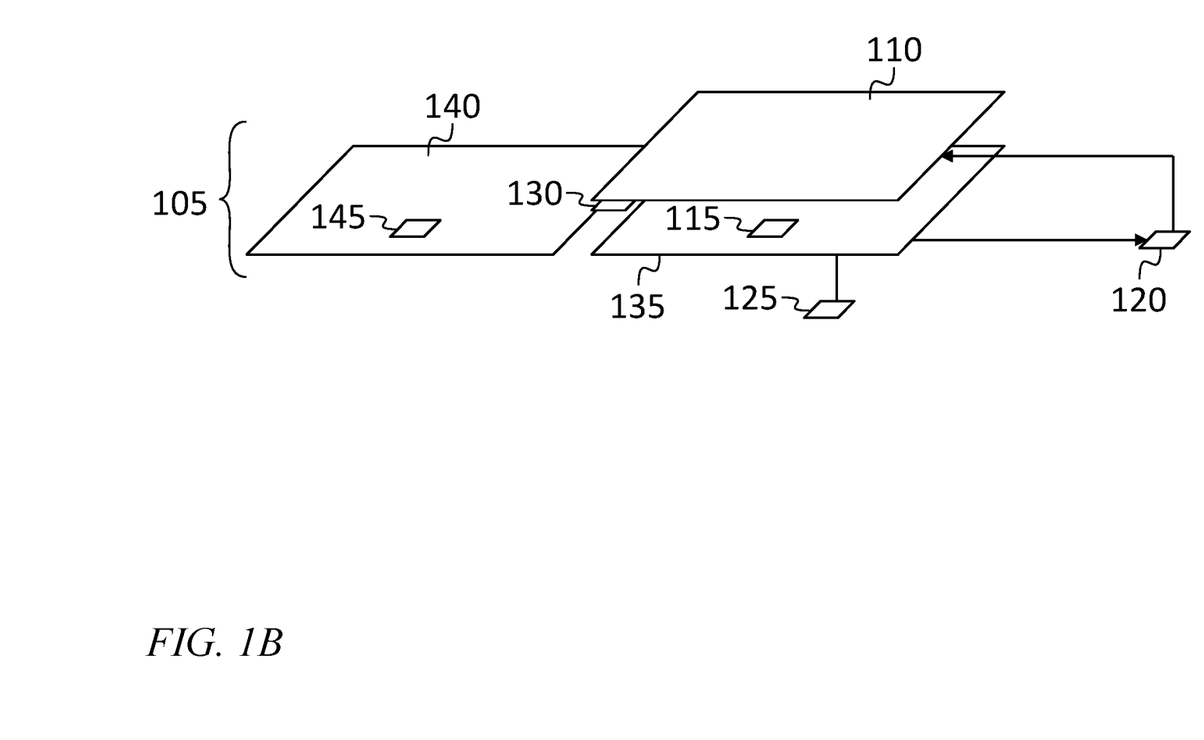
FIG. 1B is a schematic perspective drawing of solid state drive and a thermoelectric cooler, according to an embodiment of the present disclosure.

The electronic device 105 may be any electronic device that dissipates heat and that is capable of being throttled (as discussed in further detail below). The electronic device 105 may be, for example, a central processing unit of a computer (e.g., of a server), or a solid state drive, or a controller of a solid state drive. In the embodiment illustrated in FIG. 1B, the electronic device 105 is a solid state drive, which includes a solid state drive controller 135 and memory (e.g., a flash memory) 140. In such an embodiment, it may be that the temperature of the memory 140 differs, in operation, from the temperature of the solid state drive controller 135. It may also be that the maximum operating temperature of the memory 140 differs the maximum operating temperature of the solid state drive controller 135. As such, in some embodiments the processing circuit may make cooling decisions (as discussed in further detail below, in the context of FIG. 2) based on the temperature sensed by the first temperature sensor 115 and in some embodiments the processing circuit may make cooling decisions based on the temperature sensed by the second temperature sensor 130.

Figure 2A:
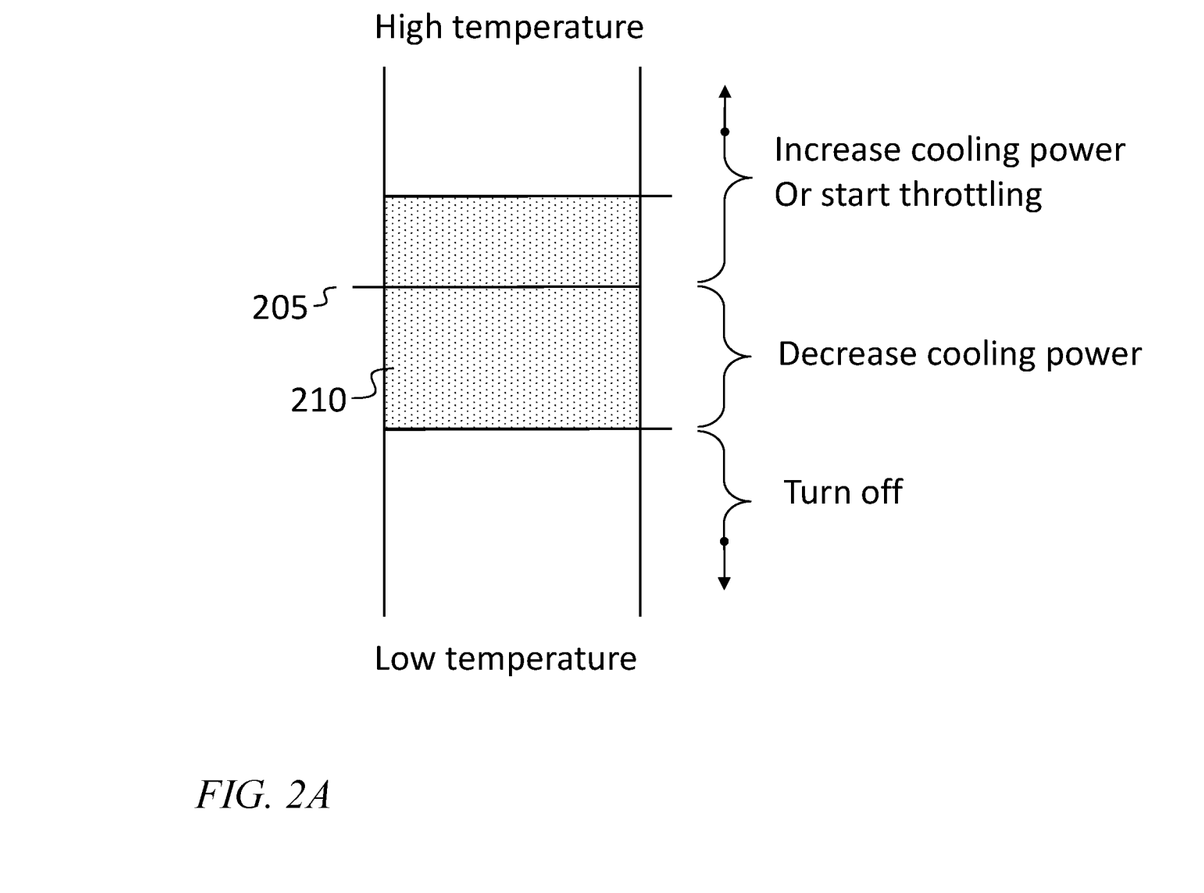
FIG. 2A is a temperature range decision diagram, according to an embodiment of the present disclosure.

FIG. 2A shows a graph of temperature, with high temperature at the top and low temperature at the bottom. Also shown on the graph are (i) a first threshold 205, and a range of temperatures, referred to as a "tolerance temperature range" 210, which may be a range of acceptable operating temperatures. As shown on FIG. 2A, and discussed in further detail below, when the sensed temperature is higher than the tolerance temperature range 210 and exceeds the first threshold 205, the system may increase the power supplied to the thermoelectric cooler 110 or (if the thermoelectric cooler drive circuit 120 is not capable of delivering more power to the thermoelectric cooler 110, or if a temperature in the system is approaching the dew point) limit an activity rate of the electronic device (i.e., "throttle" the electronic device). Limiting the activity rate of the electronic device may entail, if the electronic device is a solid state drive, limiting the rate at which the solid state drive performs operations including, but not limited to, read, write, erase, and garbage collection operations. Limiting the activity rate of the electronic device may entail, if the electronic device is a central processing unit, transitioning the central processing unit to a low power consumption state, in which the central processing unit may, for example, shut down one or more cores (if the central processing unit includes a plurality of cores), or in which the central processing unit performs operations at a reduced rate to reduce power consumption.

If the temperature is less than the first threshold 205 and within the tolerance temperature range 210, the system may decrease the power supplied to the thermoelectric cooler 110. If the temperature is below the lower end of the tolerance temperature range 210, the system may decrease the power to be equal to or less than a first power level (e.g., it may shut off the power supplied to the thermoelectric cooler 110 entirely). The first power level may be a power level that is sufficiently small to result in an acceptably small risk of any part of the system reaching the dew point, or it may be zero.

Figure 2B:
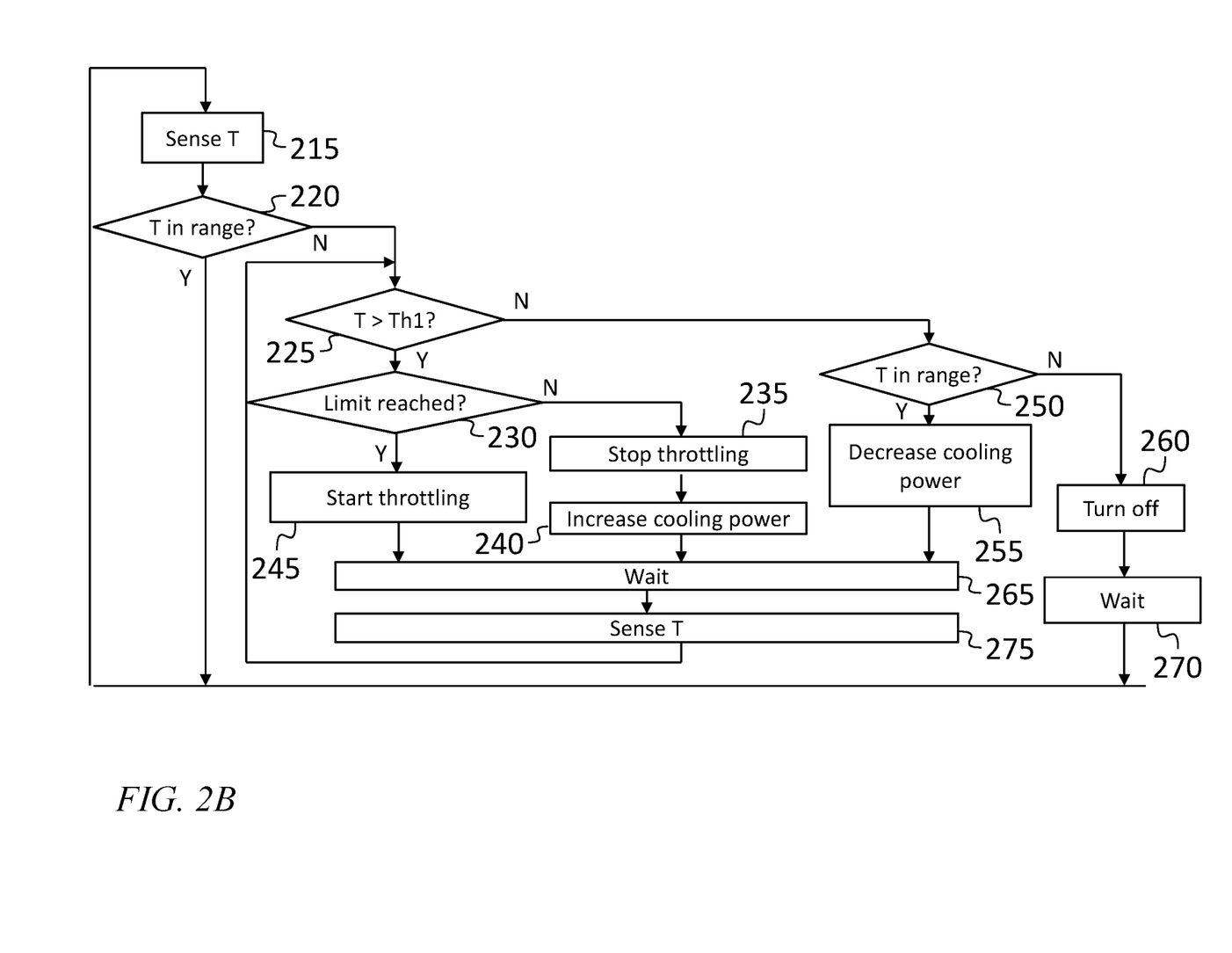
FIG. 2B is a flow chart of a method for cooling an electronic device, according to an embodiment of the present disclosure.

FIG. 2B shows a flow chart of a method for cooling a solid state drive, in some embodiments. At 215, the solid state drive controller 135 causes a temperature sensor to sense the temperature of the controller chip or of the entire solid state drive. At 220, the solid state drive controller 135 tests whether the sensed temperature is within the tolerance temperature range 210. If it is, no change is made to the power supplied to the thermoelectric cooler 110, and the system returns to sensing the temperature, at 215. While FIG. 2B is explained here in the context of an embodiment in which the method is performed by a solid state drive controller 135, in some embodiments the method could equally be performed by any suitable processor (FPGA, ASIC, etc.).

If the sensed temperature is not within the tolerance temperature range 210, the solid state drive controller 135 tests, at 225, whether the temperature exceeds the first threshold 205. If the temperature exceeds the first threshold 205, the solid state drive controller 135 tests, at 230 whether a limit on the power supplied to the thermoelectric cooler 110 has been reached (as discussed in further detail below), and, if not, it allows, at 235, the solid state drive to operate without a limit on an activity rate of the solid state drive, and causes the thermoelectric cooler drive circuit 120 to increase, at 240, the power (e.g., the average power) supplied to the thermoelectric cooler 110, e.g., by (i) increasing the drive current applied to the thermoelectric cooler 110, or (ii) increasing the drive voltage applied to the thermoelectric cooler 110, or (iii) increasing the duty cycle of a pulse-width-modulated drive current or voltage applied to the thermoelectric cooler 110, or (iv) modifying any waveform of the drive current or voltage.

The limit on the power supplied to the thermoelectric cooler 110 may be reached, for example, (i) as a result of the thermoelectric cooler drive circuit 120 already applying the maximum power it is capable of providing to the thermoelectric cooler 110, or (ii) as a result of a temperature in the system being less than the dew point plus the dew point margin. The dew point may be calculated by the solid state drive controller 135 or equivalent processing circuit from the sensed humidity using a function (e.g., a polynomial or a cubic spline) that approximates the functional form of the dew point as a function of the sensed humidity, or it may be obtained from a lookup table listing the dew point as a function of sensed humidity. The temperature that is compared to the dew point may be the same temperature (sensed by the first temperature sensor 115) that is compared to the first threshold 205 and to the tolerance temperature range 210, or it may be a temperature (e.g., a lower temperature) sensed by the second temperature sensor 130 (as discussed, and for the reasons discussed, above).

If the solid state drive controller 135 determines, at 230, that a limit on the power supplied to the thermoelectric cooler 110 has been reached, then instead of further increasing the power supplied to the thermoelectric cooler 110 it may start, at 245, throttling the solid state drive, i.e., it may limit the activity rate of the solid state drive as discussed above.

If, at 225, the solid state drive controller 135 determines that the sensed temperature does not exceed the first threshold 205, it tests, at 250, whether the sensed temperature is within the tolerance temperature range 210. If it is, it causes the thermoelectric cooler drive circuit 120 to decrease, at 255, the power supplied to the thermoelectric cooler 110. If the sensed temperature is not within the tolerance temperature range 210 (e.g., if it is below the lower end of the tolerance temperature range 210), the solid state drive controller 135 may decrease, at 260, the power to be equal to or less than a first power level (e.g., it may cause the thermoelectric cooler drive circuit 120 to shut off the power supplied to the thermoelectric cooler 110 entirely).

After having made any adjustments to the power supplied to the thermoelectric cooler 110 or to the activity rate of the solid state drive, the system waits, at 265 or at 270, during an interval of time selected to be approximately equal to the thermal reaction time of the system (e.g., to the delay between when a change is made in the power supplied to the thermoelectric cooler 110 the power supplied to the thermoelectric cooler 110 and when most (e.g., 65%) of the resulting temperature change is present at the first temperature sensor 115). The system then senses the temperature again, at 275 or at 215, and the process repeats.

The method illustrated in FIGS. 2A and 2B may be performed in an analogous manner if the electronic device is another kind of electronic device that dissipates heat and that is capable of being throttled, i.e., of operating at a reduced activity rate, and dissipating, when operating at the reduced activity rate, a reduced amount of power. In embodiments in which separate temperature control requirements apply to different components of a system (e.g., in a solid state drive having a first set of requirements for the solid state drive controller 135 and a second set of requirements for the memory (e.g., the flash memory) 140), a respective first threshold 205 and tolerance temperature range 210 may be defined for each of the components. The result of the test at 220 may then be considered to be the logical AND of the result of each of the two sensed temperatures (e.g., the result may be yes, or "Y" if it is yes when evaluated for each of the two components), and the result of the test at 225 may be considered to be the logical OR of the result for each of the two sensed temperatures. In some embodiments, the above process can be performed using a machine learning module (host side, device side, etc.) that can monitor data representing the historical performance of the device and throttle accordingly. Such a machine learning module may be based on any suitable machine learning model, or models, including without limitation artificial neural networks, decision trees, support vector machines, regression analysis, Bayesian networks, and genetic algorithms.

Figure 3:
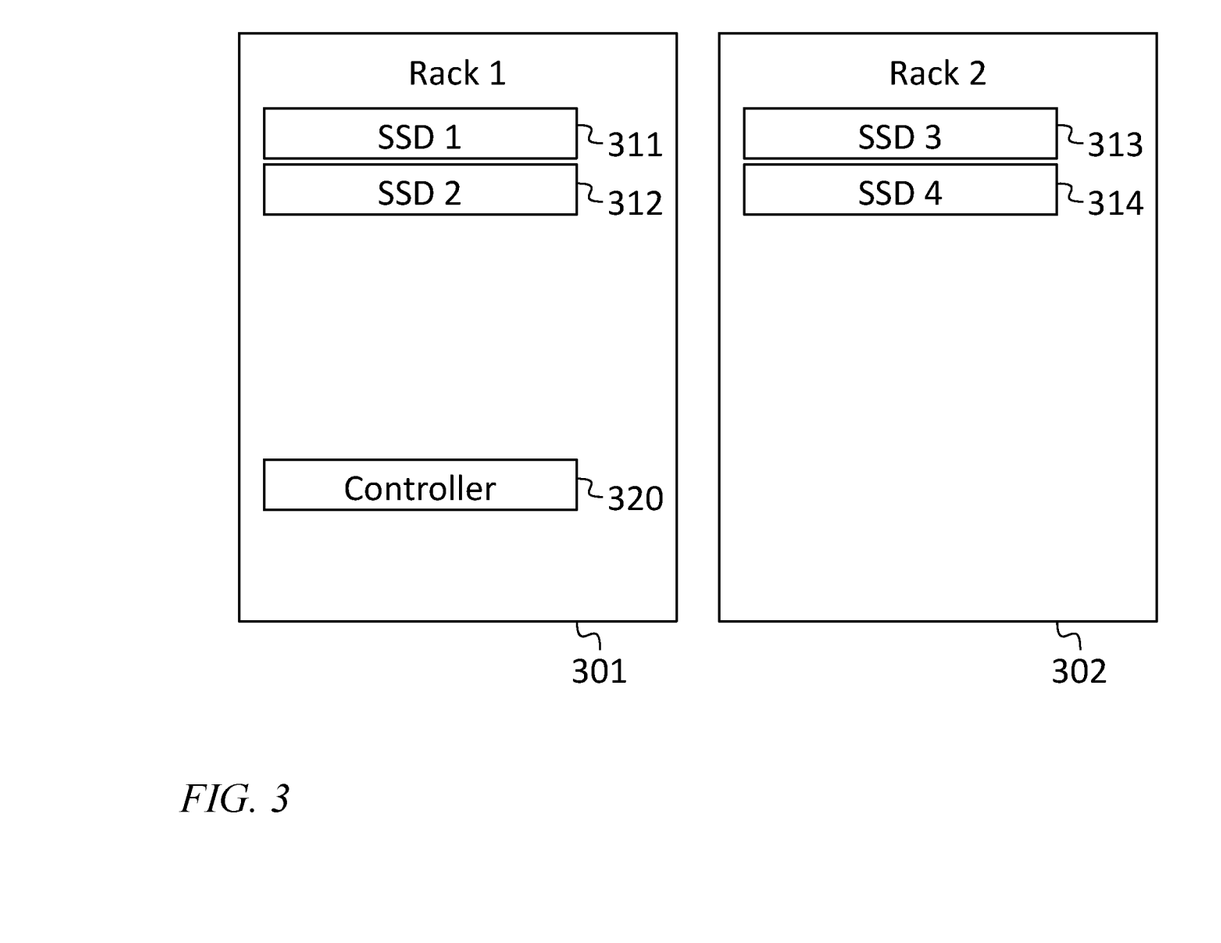
FIG. 3 is a block diagram of racks containing solid state drives, according to an embodiment of the present disclosure.

Referring to FIG. 3, in some embodiments a plurality of racks 301, 302 (of which two are shown) may be in place at a facility (e.g., at a server farm); each rack 301, 302 may house a plurality of solid state drives 311, 312, 313, 314. Each of the solid state drives may implement temperature control as described above, or, in some embodiments, a shared controller 320 may manage, e.g., all or a group of the solid state drives, or all or a group of the solid state drives in one of the racks 301, 302. In some embodiments, the shared controller 320 can be part of one device, a standalone controller, host-side, etc., and it can include any suitable circuity (e.g., processor, FGPA, ASIC, etc.). Further, the shared controller may communicate with electronic devices over a protocol such as Ethernet or any other suitable protocol with which the electronic devices are compatible. For example, the electronic devices may include Ethernet-enabled SSDs that can receive commands from the controller to send or receive temperature or humidity data and power throttling commands. The shared controller 320 may collect sensed temperatures from all of the solid state drives that it manages, and send commands to each of these solid state drives, instructing each drive regarding the power to be supplied to the thermoelectric cooler 110 and regarding whether to limit the activity rate of the solid state drive. In some embodiments the shared controller 320 can have a general view of the system as a whole and throttle power at the device level, server level, rack level, or cluster level in a data center having these SSD devices. Further, a machine learning module may be constantly monitoring and improving the power routing based on historical performance to achieve optimal power efficiency and minimizing heat losses. Such a machine learning module may be based on any suitable machine learning model, or models, including without limitation artificial neural networks, decision trees, support vector machines, regression analysis, Bayesian networks, and genetic algorithms.

Figure 4:
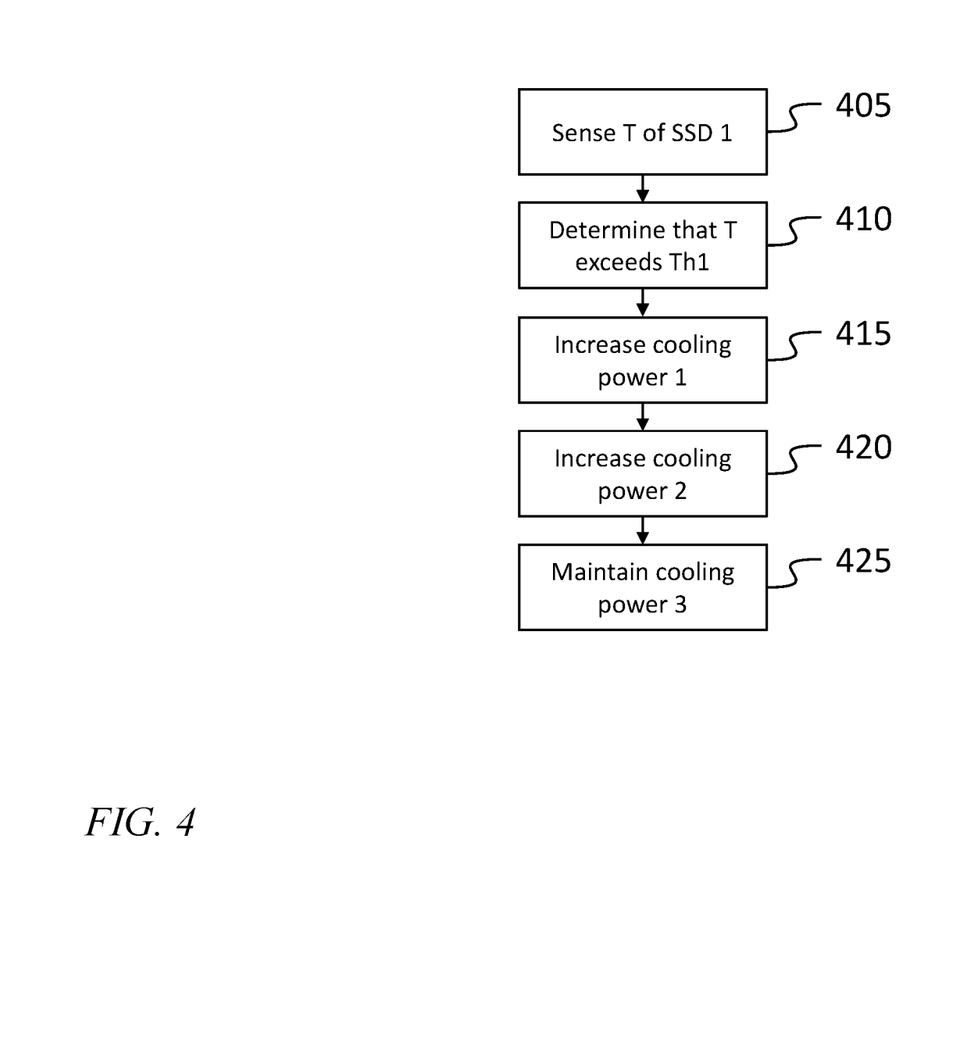
FIG. 4 is a flow chart of a method for cooling a plurality of solid state drives, according to an embodiment of the present disclosure.

In an embodiment including a plurality of racks 301, 302 each of which may house a plurality of solid state drives, it may be the case that heat is to some extent transferred between the solid state drives in a rack (but not between solid state drives in different racks), and, as illustrated in FIG. 4, the shared controller 320 may, for example, in response to sensing, at 405, a temperature of a first solid state drive 311, and determining, at 410, that the temperature exceeds the first threshold 205, cause thermoelectric cooler drive circuits 120 to increase the power supplied to the thermoelectric cooler 110 in both the first solid state drive 311, at 415, and, at 420, in a second solid state drive 312 that is in the same rack 301, but not to change, i.e., to maintain, at 425, the power supplied to the thermoelectric cooler 110 in a third solid state drive 313 that is in another rack 302. Moreover, in some embodiments the shared controller 320 may command that throttling occur in a plurality of drives that are near each other (e.g., in the same rack, or in the top half or bottom half of one rack) when any, or a few, of the thermoelectric cooler drive circuits 120 in the plurality of drives has run out of reserve drive capacity. Such an approach may be advantageous when significant heat sharing is occurring between the drives, in which case throttling a single drive may have a smaller effect on its temperature than if it were a standalone drive, isolated from other source of heat.

Any of the components or any combination of the components described (e.g., in any system diagrams included herein) may be used to perform one or more of the operations of any flow chart included herein. Further, (i) the operations are example operations, and may involve various additional steps not explicitly covered, and (ii) the temporal order of the operations may be varied.

In some embodiments, the methods described herein are performed by a processing circuit, which may (e.g., through one or more analog to digital converters connected to the processing circuit) read sensors and which may (e.g., through one or more digital to analog converters connected to the processing circuit) send control signals (e.g., to the thermoelectric cooler drive circuit 120). The solid state drive controller 135 may be a processing circuit, for example. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a first quantity (e.g., a first variable) is referred to as being "based on" a second quantity (e.g., a second variable) it means that the second quantity influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory) as the second quantity.

As used herein, the term "or" should be interpreted as "and/or", such that, for example, "A or B" means any one of "A" or "B" or "A and B". It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for thermal control for electronic devices have been specifically described and illustrated herein, many modifications and variations will be apparent to those skilled in the art. Accordingly, it is to be understood that a system and method for thermal control for electronic devices constructed according to principles of this disclosure may be embodied other than as specifically described herein. The invention is also defined in the following claims, and equivalents thereof.

What is claimed is:

1. A method for temperature control, the method comprising:
    sensing a first temperature of an electronic device;
    determining that the first temperature exceeds a first threshold; and
    in response to determining that the first temperature exceeds the first threshold, increasing a power supplied to a thermoelectric cooler thermally connected to the electronic device;
    sensing second temperature of the electronic device;
    determining that the second temperature exceeds the first threshold;
    in response to determining that the second temperature exceeds the first threshold, determining that the power supplied to the thermoelectric cooler satisfies a criterion; and
    in response to determining that the power supplied to the thermoelectric cooler satisfies the criterion, limiting an activity rate of the electronic device.

2. The method of claim 1, wherein:
    the power supplied to the thermoelectric cooler is an average power supplied to the thermoelectric cooler; and
    the increasing of the power comprises modifying a duty cycle of a pulse-width-modulated drive current applied to the thermoelectric cooler.

3. The method of claim 1, further comprising sensing a third temperature of the electronic device.

4. The method of claim 3, further comprising:
    determining that the third temperature is within a tolerance temperature range; and
    sensing a fourth temperature of the electronic device.

5. The method of claim 3 further comprising:
    determining that the third temperature is less than a second threshold, wherein the second threshold is based on a first humidity; and limiting the activity rate of the electronic device in response to determining that the third temperature is less than the second threshold.

6. The method of claim 5, further comprising:
sensing the first humidity; and
determining a dew point based on the first humidity,
wherein the second threshold is based on the dew point.

7. The method of claim 1, wherein criterion is satisfied in response to determining that the power supplied to the thermoelectric cooler is at a drive limit.

8. The method of claim 1 further comprising:
sensing the first temperature with a first temperature sensor; and
sensing the second temperature with a second temperature sensor different from the first temperature sensor.

9. The method of claim 1, wherein the electronic device is a central processing unit.

10. The method of claim 1, wherein the sensing of the first temperature of the electronic device comprises sensing a temperature of a controller of a solid state drive.

11. The method of claim 1, wherein the sensing of the first temperature of the electronic device comprises sensing a temperature of a memory component of a solid state drive.

12. A system, comprising:
a controller comprising:
a processing circuit; and
a memory;
a first solid state drive in communication with the controller, the first solid state drive including a first thermoelectric cooler thermally connected to the first solid state drive, the first solid state drive being further coupled to a first drive circuit; and
a second solid state drive in communication with the controller, the second solid state drive including a second thermoelectric cooler thermally connected to the second solid state drive, the second solid state drive being further coupled to a second drive circuit,
the memory storing instructions that, when executed by the processing circuit, cause the processing circuit to:
cause a temperature sensor to sense a first temperature of the first solid state drive;
determine that the first temperature exceeds a first threshold; and
in response to determining that the first temperature exceeds the first threshold, cause the first drive circuit to increase a power supplied to the first thermoelectric cooler and further cause the second drive circuit to increase the power supplied to the second thermoelectric cooler.

13. The system of claim 12, wherein the system comprises a first rack comprising:
the first solid state drive; and
the second solid state drive, different from the first solid state drive.

14. The system of claim 13, wherein the system further comprises a second rack comprising:
a third solid state drive,
wherein the instructions further cause the processing circuit to cause a third drive circuit to, in response to determining that the first temperature exceeds the first threshold, maintain a power supplied to a third thermoelectric cooler thermally connected to the third solid state drive.

15. The system of claim 12, wherein the instructions further cause the processing circuit to cause the temperature sensor to sense a second temperature of the first solid state drive.

16. The system of claim 15, wherein the instructions further cause the processing circuit to:
determine that the second temperature is equal to or less than the first threshold;
determine that the second temperature is within a tolerance temperature range; and
cause the first drive circuit to decrease the power supplied to the first thermoelectric cooler.

17. The system of claim 12, wherein the instructions further cause the processing circuit to,
cause the temperature sensor to sense a second temperature of the first solid state drive;
determine that the second temperature exceeds the first threshold;
determine that the power supplied to the first thermoelectric cooler is at a drive limit; and
limit an activity rate of the first solid state drive and the second solid state drive in response to the instructions that cause the processing circuit to determine that the second temperature exceeds the first threshold and further in response to the instructions that cause the processing circuit to determine that the power supplied to the first thermoelectric cooler is at the drive limit.

18. The system of claim 12, wherein the instructions further cause the processing circuit to,
cause the temperature sensor to sense a second temperature of the first solid state drive; and
transmit a command to limit an activity rate of the first solid state drive and the second solid state drive in response to the second temperature being below a second threshold.

19. A system, comprising:
a controller comprising:
means for processing; and
a memory;
a first solid state drive in communication with the controller, the first solid state drive including a first thermoelectric cooler thermally connected to the first solid state drive, the first solid state drive being further coupled to a first drive circuit; and
a second solid state drive in communication with the controller, the second solid state drive including a second thermoelectric cooler thermally connected to the second solid state drive, the second solid state drive being further coupled to a second drive circuit,
the memory storing instructions that, when executed by the means for processing, cause the means for processing to:
sense a first temperature of the first solid state drive;
determine that the first temperature exceeds a first threshold; and
in response to determining that the first temperature exceeds the first threshold, cause the first drive circuit to increase a power supplied to the first thermoelectric cooler and further cause the second drive circuit to increase the power supplied to the second thermoelectric cooler.

* * * * *